United States Patent [19]

Macdougall

[11] 4,253,107
[45] Feb. 24, 1981

[54] INTEGRATED CIRCUIT WITH ION IMPLANTED HALL-CELL

[75] Inventor: John D. Macdougall, Westborough, Mass.

[73] Assignee: Sprague Electric Company, North Adams, Mass.

[21] Appl. No.: 949,171

[22] Filed: Oct. 6, 1978

[51] Int. Cl.³ ............ H01L 27/22; H01L 29/82; H01L 29/96
[52] U.S. Cl. .................. 357/27; 357/48; 357/51; 357/91
[58] Field of Search .......... 357/26, 27, 48, 47, 357/51, 91; 307/309

[56] References Cited

U.S. PATENT DOCUMENTS

| | | | |
|---|---|---|---|
| 3,522,494 | 8/1970 | Bosch | 357/27 |
| 3,596,114 | 7/1971 | Maupin | 357/27 |
| 3,811,075 | 5/1974 | Shiga | 357/27 |
| 3,823,354 | 7/1974 | Janssen | 357/27 |
| 3,852,802 | 12/1974 | Wolf et al. | 357/27 |
| 4,011,469 | 3/1977 | Chapron | 357/27 |
| 4,123,772 | 10/1978 | Janssen | 357/27 |

*Primary Examiner*—Andrew J. James
*Attorney, Agent, or Firm*—Connolly and Hutz

[57] ABSTRACT

A Hall-cell of relatively high sensitivity and low power consumption is provided in an isolated epitaxial pocket of an integrated circuit. The epitaxial layer is of opposite conductivity type to that of the supporting silicon substrate. The Hall-cell body of opposite conductivity type consists of an ion-implanted surface portion of the pocket and may have a thickness that is limited by a buried layer of the same type as that of the substrate. This Hall-cell is capable of being manufactured with closely controlled electrical properties and by steps imposing few restraints on the quality of other components in the integrated circuit.

7 Claims, 4 Drawing Figures

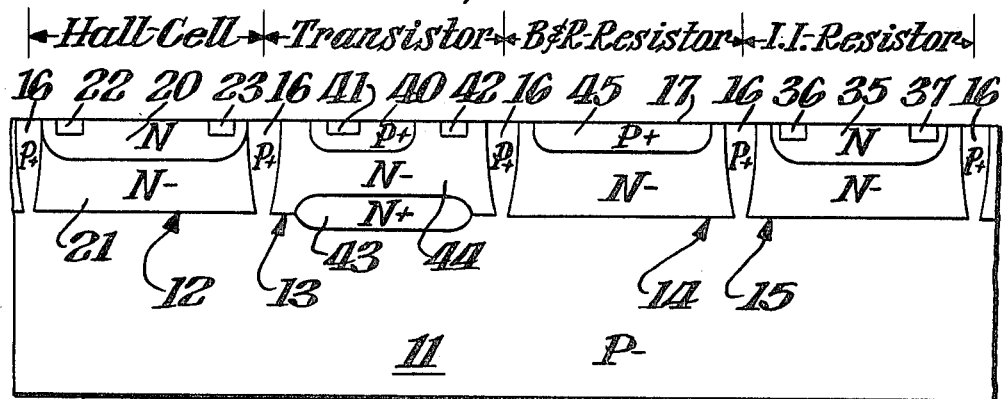
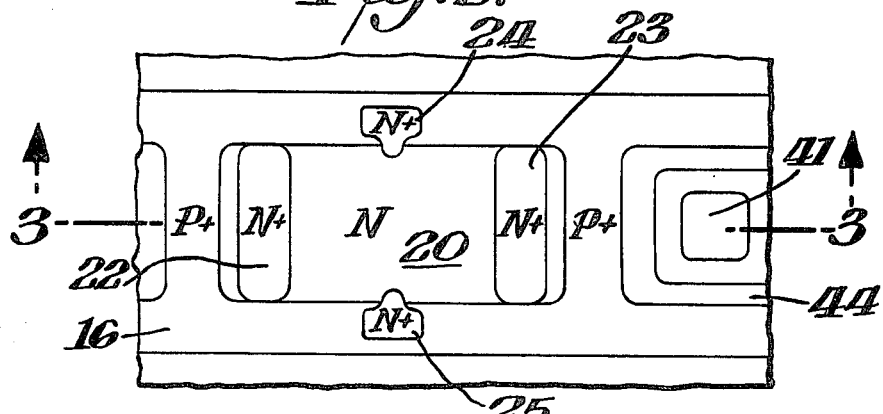
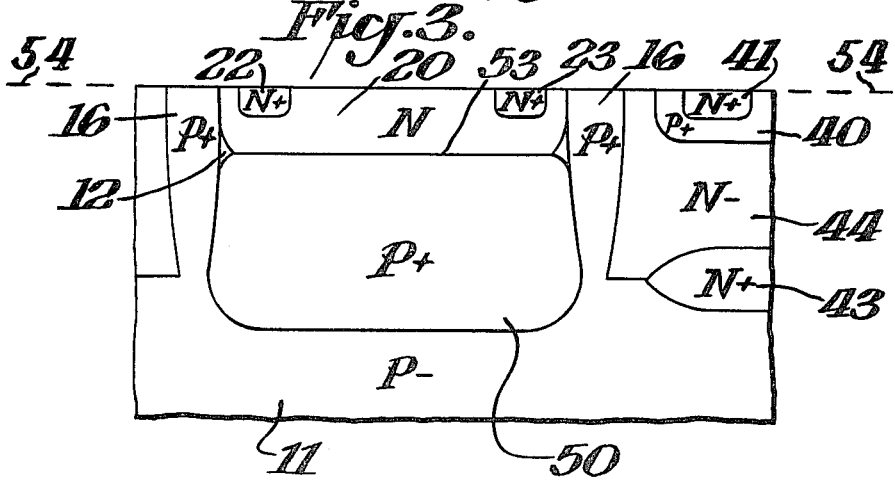

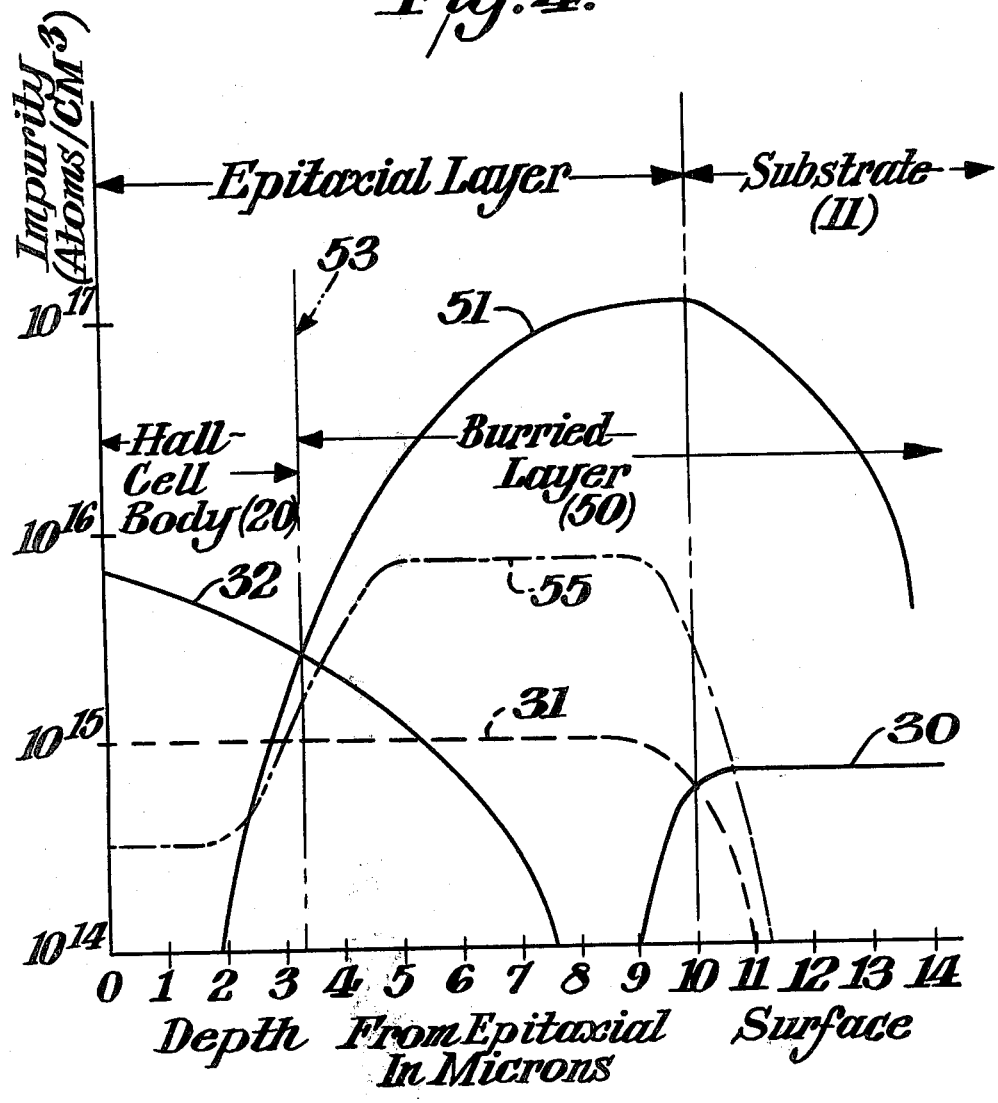

INTEGRATED CIRCUIT WITH ION IMPLANTED HALL-CELL

BACKGROUND OF THE INVENTION

This invention relates to a semiconductor integrated circuit containing a Hall-cell and more particularly to an integrated ion-implanted Hall-cell.

Integrated Hall-cells are typically formed in an isolated pocket region of an epitaxial layer having been grown over a silicon substrate. The substrate is usually of P-type conductivity while the epitaxial layer is N-type, having been uniformly doped during the epitaxial growth step. A second pair of ohmic contacts on the surface define an axis that is perpendicular to that defined by the first pair of current-passing contacts. A Hall-voltage $V_H$ is generated between the second pair of contacts which voltage is proportional to a magnetic field B that is perpendicular to both of the above noted axes in accordance with the equation $$V_H = B\mu_H(\rho/t)I \qquad (1)$$

where $\mu$H is the mobility of majority carriers in the Hall-cell body (the epitaxial layer), $\rho$ is the resistivity of the body and t is the thickness of the body.

When the Hall-cell is to be operated with a fixed voltage V across the first pair of contacts, Equation (1) is more conveniently changed to $$V_H = B\mu_H(W/L)V \qquad (2)$$

where W is the distance between the contacts of the second pair and L is the distance between the contacts of the first pair.

The magnitude and precision of the thickness t and resistivity $\rho$ of the Hall-cell is determined during the epitaxial growth step. The range of values which can be used for $\rho$ and t of the epitaxial layer are constrained by the requirement for other integrated circuit components to the approximate limits of 0.3 to 6.0 ohm-cm. and 5 to 16 microns, respectively. Specific device requirements such as transistor breakdown voltage, transistor saturation voltage, epitaxial resistor value or epitaxial resistor temperature coefficient often restrict the usable epitaxial layer parameters to the more limited range of 1-3 ohm-cm and 8-14 microns thickness.

In volume manufacturing, typical overall tolerances for the resistivity and thickness of the epitaxial layer are +15% for each parameter. Thus, in the case of operation at constant current I, it can be seen from the above equation that the Hall-cell voltage which depends upon $\rho/t$ can vary as much as ±30%. On the other hand, in operating with a fixed voltage applied between the first pair of contacts, the dependence of the Hall-cell voltage $V_H$ on epitaxial parameters is greatly reduced. However, in this case the power consumption of the Hall-cell can now vary ±30% which is unsatisfactory for many applications.

For a given epitaxial resistivity and power consumption, the Hall-cell sensitivity (or the magnitude of $V_H$ in a given magnetic field) increases as the thickness of the epitaxial layer is decreased. Thus for optimum Hall sensitivity it is desirable to reduce the thickness of the Hall-cell body. This can be accomplished by introducing P-type impurities from either the top or the bottom surface of the epitaxial layer to occupy a portion of the above said pocket. However, when the thickness of the Hall-cell body is reduced in this manner, the absolute tolerance on the thickness of the body is degraded. For example, if in a 10 micron thick epitaxial layer of N-type, a P-type buried layer occupies ⅔ of the epitaxial pocket, the unaltered N-type epitaxial layer portion becomes the Hall-cell body and has a thickness of 3.3 microns. The thickness of the epitaxial layer having an initial tolerance of ±15% leads to a tolerance on the thickness of the Hall-cell body of greater than ±45%. The resulting variation in power consumption or in Hall sensitivity will be unsatisfactory for most applications.

It is an object of this invention to provide an integrated semiconductor circuit having a Hall-cell in an isolated portion of an epitaxial layer, the parameters of the Hall-cell being independent of the resistivity and thickness of the epitaxial layer and thus capable of more precise control in manufacture.

It is another object of this invention to provide in an integrated circuit a Hall-cell with precisely controlled sensitivity and power consumption.

It is a further object of this invention to provide an integrated circuit with a precisely controlled Hall-cell capable of being formed by methods more compatible with and less restrictive of the method steps which may be used to form, and control the parameters of, other integrated circuit components such as resistors and transistors.

It is also an object of this invention to provide in an integrated circuit a Hall-cell and resistors, all having precisely controlled values of resistance and the same temperature coefficient of resistance.

SUMMARY OF THE INVENTION

An integrated circuit has a single crystal substrate of one conductivity type and an epitaxial layer of the opposite conductivity type. A Hall-cell is formed in an isolated pocket of the epitaxial layer. The Hall-cell contains ion implanted impurities of the opposite type having a maximum concentration in a plane that is parallel to the outer epitaxial surface. Currents flowing in the Hall-cell may advantageously be further confined to the precisely doped ion-implanted portion by providing in the pocket a buried layer of the one type. When the Hall-cell body lies near the outer epitaxial surface, the virgin or unaltered epitaxial layer may have a graded profile of dopants wherein the lower concentration of impurities is near the outer surface, enhancing the precision with which the Hall-cell may be made and further minimizing restraints on the structure of components formed in other pockets of the integrated circuit. The ion implanted Hall-cell of this invention is inherently capable of precise resistivity control. The disadvantage of higher resistivity resulting from the ion-implantation is off-set by concentrating the ion-implanted impurities near the above mentioned plane and by limiting the thickness of the active region in the Hall-cell.

BRIEF DESCRIPTION OF THE DRAWINGS

FIG. 1 shows in side sectional view a portion of an integrated circuit of this invention.

FIG. 2 shows in top surface view the Hall-cell portion of the integrated circuit of FIG. 1, enlarged by a factor of about two.

FIG. 3 shows in side sectional view the Hall-cell portion of FIG. 2 taken in plane 3—3 with a buried layer having been added.

FIG. 4 is a graph of the various impurity densities in the Hall-cell of FIGS. 1 and 3 plotted as a function of the distance from the surface of the epitaxial layer.

DESCRIPTION OF THE PREFERRED EMBODIMENTS

The integrated circuit 10 of FIG. 1 illustrates a first preferred embodiment of this invention. It includes a single crystal silicon substrate 11 having been lightly doped with P-type impurities. Over the top face of the substrate 11 there is grown one epitaxial layer doped with N-type impurities, which layer is subsequently divided into N-type conductivity pockets 12, 13, 14, 15 and other pockets (not shown) by means of a network of isolation walls 16 containing a heavy concentration of P-type impurities. Alternatively, dielectric isolation may be used in the practice of this invention.

The epitaxial layer is grown by a well known method of heating and exposing the substrate 11 to a gaseous mixture containing a silicon precursor compound such as silicon tetrachloride and a gaseous precursor of dopant impurities of N-type polarity such as phosphine. When the concentration of the impurities in the gaseous mixture is held constant, then the density of impurities produced in the epitaxial layer is highly uniform throughout the layer. The P-type isolation walls are made by diffusing P-type impurities through a photolithographic mask on the surface 17 of the epitaxial layer or by any other known methods. The substrate 11 is then heated to drive the surface deposited impurities by diffusion into and through the epitaxial layer to the substrate.

A Hall-cell is formed in pocket 12 by providing a silicon dioxide mask (not shown) over the surface of the epitaxial layer with an opening over pocket 12, and selectively ion implanting impurities of the N-type into this pocket. During subsequent heating steps the ion implanted impurities are diffused part way through the epitaxial layer creating a graded region 20 wherein the impurity concentration is greatest at the surface and is greater everywhere than the unaltered N-type portion 21 of pocket 12 lying below graded region 20, as shown. It is preferred that the ion implantation step be accomplished prior to the standard base diffusion step. Then two heavily doped N-type contact regions 22 and 23 are formed by diffusion through a suitable mask near opposite ends of the surface portion of pocket 12 to which metal conductors (not shown) will make good ohmic contact. Similarly two Hall-voltage contact regions of N-type, 24 and 25, are formed at opposite side portions of pocket 12 as illustrated in FIG. 2.

It is alternatively possible to perform the ion implantation non-selectively, that is without masking, immediately after the epitaxial growth step, However, this approach has limited application because of a resulting degradation of other device parameters and the aforenoted selective ion implantation is preferred.

In the graph of FIG. 4, the impurity concentrations resulting from each of the above described doping steps is shown. Line 30 depicts the concentration of P-type impurities in the substrate 11. Line 31 shows the highly uniform initial doping of the epitaxial layer. Line 32 shows the profile of the ion-implanted impurities which dominate region 20.

In a typical integrated circuit manufacturing facility, the sheet resistivity of the epitaxial layer may be controlled only to within $\pm 15\%$ of a predetermined design value. On the other hand, the sheet resistivity of an ion-implanted region (e.g. 20) is controlled to within $\pm 2\%$. Thus when the ion-implanted impurities in region 20 have a much greater density than those of the original epitaxial layer in pocket 12, any current flowing in the pocket between contact regions 22 and 23 is concentrated almost entirely in region 20. This has the outstanding advantage over a Hall-cell of the prior art wherein currents flow only or predominantly in uniformly epitaxially doped pocket regions, that the accuracy with which one can control either the resistance and thus the sensitivity at constant current in the Hall-cell or the Hall-cell power consumption at constant voltage, is greatly enhanced.

The resistance of a Hall-cell of the prior art varies directly with the ratio $\rho/t$, where $\rho$ is the epitaxial layer resistivity and $t$ is the epitaxial layer thickness. This resistance can be controlled in a typical manufacturing operation to only $\pm 30\%$. In the ion-implanted Hall-cell of FIG. 1, the resistance of the Hall-cell is determined by the parallel N-type conducting regions consisting of the more heavily doped implanted region 20 and the underlying unaltered N-type epitaxial portion 21 of the pocket 12. The term "unaltered", as applied to a doped portion of an epitaxial region, means those epitaxial portions in which the concentration of impurities is not different by more than 10% from that in the originally grown epitaxial material.

In the embodiment described above, the unaltered and uniformly doped portion of the epitaxial pocket 21 has a resistivity of 5 ohm-centimeters and is about twice as thick as the ion implanted region 20 which has an average resistivity of 1 ohm-centimeters. Thus, approximately 70% of the current between contact regions 22 and 23 flows through region 20, so that the accuracy of control of the resistance between contact regions 22 and 23 that may readily be achieved in production is $0.70\times 2\% +0.30\times 30\% =10.4\%$ which is about three times more precise than was achieved in the prior art.

In an alternate embodiment to that shown in FIG. 1, the altered region 20 may extend completely through the epitaxial pocket 12. In this case, the accuracy of control of Hall-cell resistance will be essentially unchanged from that of the first preferred embodiment.

In the above noted silicon dioxide mask also is provided an aperature over the pocket 15. Thus, during the implanting of impurities of N-type to form Hall-cell region 20, there are also implanted N-type impurities into the pocket 15 to form an implanted resistor region 35, having the same resistivity and the same temperature coefficient of resistance (TCR) as that of the Hall-cell body region 20. Resistor contact regions 36 and 37 are formed simultaneously with contact regions 22, 23, 24 and 25. A particular instance in which it is found advantageous to incorporate a Hall-cell and resistors having the same TCR is disclosed by Genesi in U.S. Pat. No. 3,816,766 issued June 11, 1974, and assigned to the same assignee as is the present invention.

In pocket 13 there is a planar NPN-transistor, the base region 40 being formed by masking and diffusing P-type impurities through the surface 17 part way into pocket 13. An N-type emitter region 41 and a collector contact region 42 are formed simultaneously with contact regions 22, 23, 36 etc. by diffusion. A buried layer 43 is formed by depositing N-type impurities on the face of the substrate 11 prior to growing the epitaxial layer. Subsequent heating steps cause these buried impurities to enlarge the buried layer 42, substantially to the profile shown in FIG. 1.

In pocket 14 there is a diffused resistor 45 which is formed by diffusing P-type impurities through an aperature in the above mentioned base diffusion mask, being accomplished simultaneously with the forming of the base region 40.

However, the ion-implanted Hall-cell body 20, of the first preferred embodiment as shown in FIG. 1 should have the lowest possible impurity concentration because for N-type impurities, the Hall mobility $\mu_H$ decreases slowly as concentration increases beyond $10^{14}$ $cm^3$, with a resulting decrease in the magnitude of the Hall voltage according to Equation (1). Also, as the impurity concentration in the Hall-cell body is increased, the absolute power consumption of the Hall-cell operated at fixed voltage increases as seen in Equation (2). To realize full advantage of the possible precision in the ion-implanted Hall-cell body as explained above, it is necessary that the original concentration of N-type impurities of the epitaxial layer be several times lower yet. This leads to a high resistivity epitaxial layer, and various other integrated circuit device parameters may be adversely affected. For example, low resistivity epitaxial layers are needed to obtain a low saturation voltage in a planar NPN transistor.

In the second preferred embodiment illustrated in FIG. 3, the above noted restraint imposed by a high resistivity ion implanted Hall-cell on other components in the integrated circuit is greatly reduced.

FIG. 3 shows the integrated circuit Hall-cell of FIG. 1 with a heavily doped P-type buried layer 50 in the Hall-cell pocket 21. The dopant concentration profile of buried layer 50 is shown in FIG. 4 by line 51. The addition of buried layer 50, reduces the effective thickness of the Hall-cell body region 20 and thus reduces the power consumption of the device. If a conventional epitaxial Hall-cell layer of thickness t±15% is reduced to one third its thickness by a buried P+ layer, the control of the resulting thickness is no better than ±45% and this variation in thickness is reflected directly in the Hall-cell power consumption. In addition the resistivity of the epitaxial layer may vary +15% with a resulting overall tolerance of ±60% for the Hall-cell resistance (or power consumption at a fixed voltage). Since in this invention, a buried layer 50 confines the active Hall-cell region to the more heavily doped portion of the ion implanted region 20 (see line 32 in FIG. 4), the resistivity control for the layer 20 of reduced thickness can approach ±2%. Furthermore, since the layer 50 (line 51 of FIG. 4) intersects the layer 20 (line 32 of FIG. 4) at a plane 53 below the maximum ion-implanted impurity concentration at the surface, a lessened dependence of Hall resistance upon Hall-cell body thickness results.

This may be seen with reference to FIG. 4 showing intersection of lines 32 and 51 at an impurity concentration of $3 \times 10^{15}$ whereas the average concentration in the 3.3 micron thick Hall-cell body 20 is approximately $6 \times 10^{15}$. Thus, for a ±45% variation in thickness only a 22.5% variation in Hall-cell resistance results. Therefore in the second preferred embodiment of this invention, a Hall-cell body, one third the thickness of the epitaxial layer can be obtained having a resistance value controlled to approximately ±25% as compared to ±60% by a prior art epitaxial Hall-cell body that is similarly thinned by using a buried layer. This represents a 2.4 times improvement.

For some applications the use of an epitaxial layer doped at $10^{15}/cm^3$ (5 ohm-cm) does not permit satisfactory parameters, such as transistor saturation voltage, to be realized for transistors and other devices in the integrated circuit. Since a Hall-cell body of this invention located near the outer epitaxial surface 54 requires a relatively low epitaxial doping concentration near the surface 54, it is desirable to have a means for accomplishing this without for example, increasing transistor saturation voltage. This can be accomplished by introducing a graded or stepped epitaxial-doping profile as indicated by line 55 in FIG. 4 (instead of the epitaxial-doping profile indicated by line 31 in FIG. 4). The profile 55 can be realized by starting the epitaxial growth at approximately 1 ohm-cm and reducing the gaseous impurity flow to that required to obtain 10 ohm-cm part way through the epitaxial deposition cycle. Since the active Hall-cell layer is substantially confined to the low concentration region of profile 55 by buried layer 30 (profile line 51), the resistivity of the Hall-cell body 20 is for practical purposes totally dependent upon the concentration of ion implanted impurities in this region. At the same time the saturation voltage of NPN transistors (as in pocket 13 of FIG. 1) that are manufactured simultaneously depends primarily upon the epitaxial layer resistivity below the base region (e.g. 40), which base regions typically extend 3 microns below the surface. Such low saturation voltage transistors can be manufactured while maintaining full advantage of an ion implanted Hall-cell body.

In a third preferred embodiment of this invention a shallow layer of ion implanted impurities of the same polarity as that of the epitaxial layer (e.g. N-type) are selectively deposited at the surface of the substrate (e.g. 11) at the site of one pocket (e.g. 12). Then after growing the epitaxial layer, the substrate is heated to diffuse the ion implanted impurities upwardly to form a buried layer of about the same relative shape as that of region 50 in FIG. 3. This ion implanted buried layer then serves as the Hall-cell body, the maximum concentration of impurities in the pocket now lying in a plane near the substrate and parallel to the outer epitaxial surface (e.g. 54). The shallow "emitter" contact regions (e.g. 22, 23, 24 and 25) will adequately serve to provide electrical access to the buried Hall-cell body, although the extra steps necessary to provide deeper contact regions will improve the performance characteristics. An additional improvement in the above described structure of the third embodiment may be achieved by forming a P-type layer at the surface (e.g. 54) of the epitaxial layer to further limit and define the thickness of the buried Hall-cell layer.

What is claimed is:

1. An integrated circuit comprising a single crystal semiconductor substrate of one conductivity type; an epitaxial semiconductor layer of the opposite conductivity type carried on one face of said substrate; means for electrically isolating a plurality of pockets in said epitaxial layer from one another, and; a Hall-cell of said opposite conductivity type being formed in one of said pockets, said Hall-cell containing ion implanted impurities of said opposite conductivity type which have a maximum concentration in a plane that is parallel to the outer surface of said epitaxial layer for increasing the conductivity of said Hall-cell above that of unaltered opposite conductivity portions of said epitaxial layer and for concentrating currents flowing through said Hall-cell in a region near said plane.

2. The integrated circuit of claim 1 additionally comprising a bipolar transistor being formed in another of said pockets, the collector of said transistor being comprised of an unaltered opposite conductivity portion of said epitaxial layer.

3. The integrated circuit of claim 1 wherein said plane of maximum impurity concentration lies near said epitaxial surface.

4. The integrated circuit of claims 2 and 3 wherein the concentration of opposite conductivity type impurities in said unaltered portions of said epitaxial layer is greater near said face than near said outer surface.

5. The integrated circuit of claim 1 additionally comprising a buried layer of said one conductivity type being located at the interface of said one pocket and said substrate, said buried layer extending partway into said epitaxial layer to confine said Hall-cell to a thin outer surface region of said one pocket, the conductivity of said buried layer being greater than that of said substrate.

6. The integrated circuit of claim 1 additionally comprising a resistor being formed in another of said pockets, the body of said resistor containing the same concentration of opposite type impurities as that of said Hall-cell at any given distance from said outer surface whereby the temperature coefficient of resistance of said resistor is the same as that of said Hall-cell.

7. The integrated circuit of claim 1 wherein said one conductivity type is p-type.

* * * * *